Dec. 5, 1961 M. E. JONES ET AL 3,012,175

CONTACT FOR GALLIUM ARSENIDE

Filed Sept. 1, 1960

INVENTORS
Morton E. Jones,
Donald P. Miller &
Ernest C. Wurst
BY
Stevens, Davis, Miller & Mosher
ATTORNEYS United States Patent Office 3,012,175 Patented Dec. 5, 1961

3,012,175
CONTACT FOR GALLIUM ARSENIDE

Morton E. Jones, Richardson, and Donald P. Miller and Ernest C. Wurst, Dallas, Tex., assignors to Texas Instruments Incorporated, Dallas, Tex., a corporation of Delaware Filed Sept. 1, 1960, Ser. No. 53,509
12 Claims. (Cl. 317—237)

The present invention relates to contact materials for gallium arsenide and constitutes an improvement to the invention disclosed incopending application Serial No. 3,679, filed January 20, 1960. More particularly, this invention relates to contacts of gold-tin and silver-tin alloys for gallium arsenide which can form rectifying attachments therewith.

With the advent of compound semiconductor materials, the semiconductor art has been materially extended. Although these discoveries in this semiconductor art have broadened research horizons, the new compound semiconductor materials pose many problems in the adaptation of these materials to specific applications.

Of the new compound semiconductor materials, the one appearing to have the greaatest promise is gallium arsenide. This material has desirable properties as regards lifetime, energy gap, and mobility, and, perhaps, its most outstanding feature is its ability to withstand elevated temperatures. It is already known that gallium arsenide can be used at temperatures up to 400° C. without any harmful or injurious effects on the material.

One of the many problems confronting the researchers in this field is to conceive and develop contact materials for gallium arsenide to form ohmic connections therewith and rectifying connections therewith. When compound semiconductors, having an element selected from Group III and an element selected from Group V of the Periodic Table of Elements (as used herein the Periodic Table of Elements shall mean that table as now generally portrayed according to Mendelejeff) were first introduced, it was supposed that the impurity materials suitable for affecting conductivity would be those elements appearing in Groups II and VI of the Periodic Table. This was believed to be true with respect to gallium arsenide. Thus, it was found possible and practical to produce p-type gallium arsenide using, for example, zinc. On the other hand, attempts to produce n-type gallium arsenide with the elements of Group VI have been fraught with problems. The materials appearing in Group VI include oxygen, sulfur, selenium and tellurium. Oxygen forms deep-lying level traps for electrons in the semiconductor material (gallium arsenide). Sulfur, selenium and tellurium, though usable, are exceedingly difficult to handle and many problems arise when attempting to dope with these elements from a melt. For example, alloying a tellurium alloy to gallium arsenide will not dope compound semiconductor materials to a sufficient level to form transistor emitters or pn junctions in tunnel diodes.

In view of the foregoing, research has been necessary to find n-type contact materials which are easy to apply and which will produce effective results. It has already been proposed to use tin, a Group IV materials, as an n-type contact to gallium arsenide and use of this material for this purpose has been quite successful. Unfortunately, there are several drawbacks to the use of this material. First of all, tin has a relatively low melting point, considerably below the maximum temperature at which devices made of gallium arsenide can operate. For example, tin melts at a temperature of 232° C. and a gallium arsenide device should operate well up to around 400° C. A further disadvantage when using tin is that this material is extremely soft and malleable. Moreover, when a device including a tin contact is placed in a microwave package, the tin softens and will bridge the junction creating a short. As a specific illustration of this, a tunnel diode prepared from gallium arsenide using tin as a contact may lose its tunneling characteristics when the device is placed in a microwave package because the tin will soften and short the junction.

Thus far, there have been many proposals for an n-type contact to gallium arsenide material, but none is completely satisfactory. It is the principal feature of the present invention, therefore, to provide specific materials that will be completely suitable for use as n-type contact materials for gallium arsenide. These materials will possess the requisite hardness and also will have a maximum operating temperature above that which characterizes the gallium arsenide semiconducting material.

It is therefore an object of the present invention to provide as a contact material for gallium arsenide an alloy consisting of gold and tin in specific proportions; the alloy will have requisite hardness and a suitable maximum operating temperature.

It is also an object of the present invention to provide as a contact material for gallium arsenide an alloy consisting of silver and tin in specific proportions. The material will have the necessary hardness and also will possess a maximum operating temperature in excess of that characterizing the gallium arsenide semiconductor material.

Other and further objects of the present invention will become evident as the following specific description unfolds when taken in conjunction with the appended drawings, in which.

Figure 1:
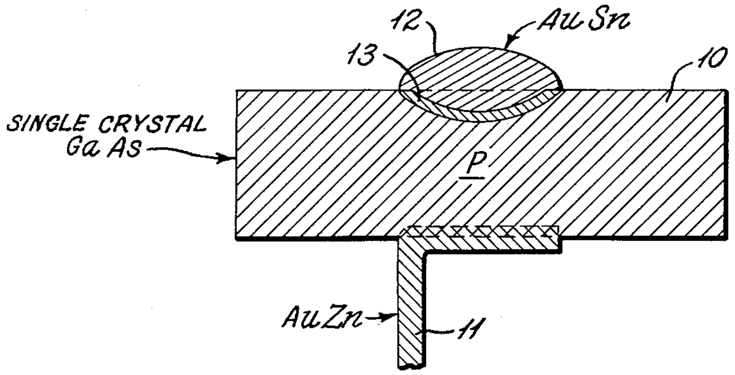
FIGURE 1 is a view in cross section of a gallium arsenide diode embodying the principles of the present invention.

Referring now to the drawings, a gallium arsenide diode embodying the principles of the present invention is illustrated in FIGURE 1. As shown, a thin wafer 10 of gallium arsenide, preferably of single crystal formation, characterized by p-type conductivity is provided. The use of any of the recognized p-type active impurity elements is permissible in the present invention. A gold-zinc alloy electrode 11 is attached to one face of wafer 10 by a conventional alloying process to form an ohmic contact. Attached to the opposite face is a contact 12 which forms a rectifying connection with the p-type surface of wafer 10. The contact material consists of an alloy of gold and tin in substantially equal proportions or, in other words, in the ratio of about 50 to 50 in terms of atomic percent. The composition from a weight standpoint consists of about 62 percent gold and about 38 percent tin. The material is originally placed on the wafer 10 as a dot, and the wafer then raised to a temperature at which wetting between the p-type gallium arsenide surface and the contact material occurs. Thereafter, the wafer is cooled resulting in regrowth and the creation of a p-n junction. The regrown region 13, as is known in the art, is a continuation of the single crystal form of the main body of water 10. The remaining contact material solidifies as a polycrystalline mass.

The gold-tin alloy melts at 418° C.; however, the alloying of the contact material is accomplished at a temperature above 575° C. in an inert or reducing atmosphere. The preferred alloying temperature is approximately 700° C., and caution must be exercised to keep the alloying temperature below about 850° C. as there is danger of altering the resistivity profile of the wafer. This procedure ensures good wetting between the contact material and the gallium arsenide which is required to form the junction.

The resulting contact exhibits a melting point of about 355° C. at which temperature it appearently forms a eutectic with the gallium arsenide material. Above this temperature it begins to melt resulting in a faulty junction. This specific composition produces an n-type contact characterized by a conductance greater than $1.5 \times 10^3$ mhos per $cm.^2$.

If the diode illustrated in FIGURE 1 is a tunnel diode, the main body of the wafer 10 is doped, for example, with zinc to degeneracy. The techniques of doping a wafer to degeneracy are well known in the art and form no part of this invention. When making a tunnel diode, it is important to cool the contact 12 quickly after alloying to preserve the composition of the mass. Tunnel diodes have been produced in accordance with the present invention which exhibit a peak-to-valley current ratio $(I_p/I_v)$ as high as 39.

The contact 12, in place of consisting of the aforementioned specific composition of gold and tin, can consist of an alloy of 48 percent silver and 52 percent tin by weight. This composition is also in the proportion of about 50 to 50 in terms of atomic percent. The melting point of this contact material is about 475° C., and contacts formed from this material are good up to about 400° C. beyond which temperature they melt. The silver-tin alloy also apparently forms a eutectic with the gallium arsenide.

Figure 2:
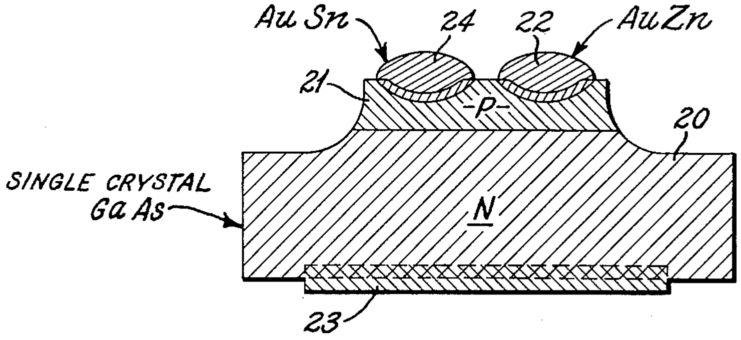
FIGURE 2 is a view in cross section of a gallium arsenide transistor device embodying the principles of the present invention.

Illustrated in FIGURE 2 is a transistor composed of a wafer 20 of n-type signal crystal gallium arsenide. The wafer 20 has diffused into its upper surface a p-type layer 21. The technology for accomplishing this step is well known by those skilled in this field. By way of example, zinc can be diffused into the wafer 20 to accomplish this result. A gold-zinc contact 22 is alloyed to the diffused p-type layer 21, thus providing an ohmic connection. A rectifying contact 24 is also made to the diffused layer 21. This rectifying contact 24 consists of an alloy of gold and tin in the same proportions as used for the contact 12 of FIGURE 1. Again, as before, the contact material may consist of an alloy of silver and tin in the same proportions as previously given. A suitable ohmic collector contact 23 is attached to the opposite face of the wafer 20. As is clear, the contact 24 constitutes the emitter and emitter contact of the transistor, contact 22 is the base contact, and, as already noted, contact 23 is the collector contact. Transistors have been produced in accordance with the teachings of this invention with alphas as high as 0.67.

Figure 3:
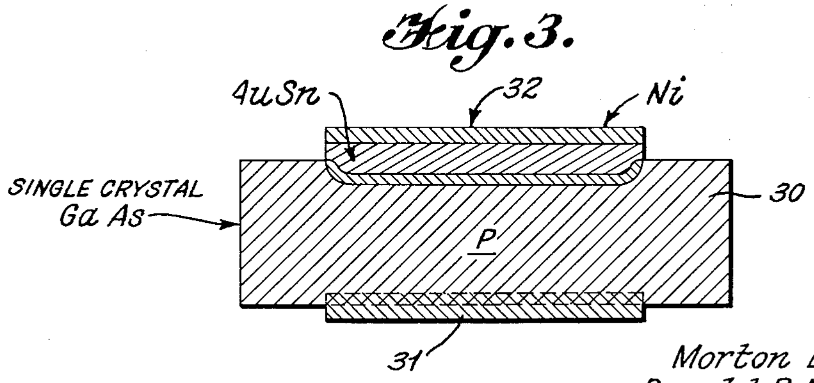
FIGURE 3 portrays an alternative design for a gallium arsenide diode embodying the principles of the present invention.

A refinement of the present invention is illustrated in FIGURE 3. Here, again, a diode is shown to demonstrate a feature of the invention. A single crystal gallium arsenide wafer 30 has an ohmic electrode 31 attached to one face. Any suitable material can be used for this purpose. A rectifying electrode, generally designated as 32, is attached to the opposite face of the wafer 30. Electrode 32 consists of a deposited film of an alloy of gold and tin in the proportions previously given which has been alloyed into the wafer 30 to form a p-n junction. A film of nickel is deposited over the gold-tin alloy and then the contact is annealed. The addition of the nickel plate is optional but it has been observed that the conductance of the contact is improved about 1½ times by use of the nickel.

The processes as outlined above for the manufacture of various gallium arsenide devices have been set forth leaving out certain necessary etching, cleaning, and other steps, all of which are conventional in the art of making semiconductor devices. The omission of these steps has been for simplicity's sake as they form no part of the inventive concept.

Although the present invention has been shown and illustrated in terms of specific preferred embodiments, it will be apparent that changes and modifications are possible which do not depart from the teachings herein. Such changes and modifications are deemed to come within the purview of the spirit and scope of this invention.

What is claimed is:

1. A gallium arsenide device comprising a body of gallium arsenide having a surface portion of p-type conductivity, a rectifying electrode alloyed to said surface portion consisting of tin and an element selected from the group consisting of gold and silver, said electrode comprised of tin and said element in substantially equal atomic proportions, and an ohmic electrode attached to said body.

2. A device as recited in claim 1 wherein said element is gold.

3. A device as recited in claim 1 wherein said element is silver.

4. A gallium arsenide diode consisting of a body of gallium arsenide of p-type conductivity, a rectifying electrode alloyed to said body consisting of tin and an element selected from the group consisting of gold and silver, said electrode comprised of tin and said element in substantially equal atomic proportions, and an ohmic electrode attached to said body.

5. A gallium arsenide tunnel diode consisting of a gallium arsenide wafer of p-type conductivity doped to degeneracy, a rectifying electrode alloyed to said wafer consisting of tin and an element selected from the group consisting of gold and silver, said electrode comprised of tin and said element in substantially equal atomic proportions, and an ohmic electrode attached to said body.

6. A tunnel diode as recited in claim 5 wherein said element is gold.

7. A tunnel diode as recited in claim 5 wherein said element is silver.

8. An npn gallium arsenide transistor consisting of a body of gallium arsenide defining contiguous n and p regions, a rectifying electrode alloyed to said p region consisting of tin and an element selected from the group consisting of gold and silver, said electrode comprised of tin and said element in equal atomic proportions, and electrodes attached to said n and p regions.

9. A transistor as recited in claim 8 wherein said element is gold.

10. A transistor as recited in claim 8 wherein said element is silver.

11. An npn gallium arsenide transistor consisting of a body of n-type gallium arsenide defining a p-type surface diffused layer, a rectifying electrode alloyed to said layer consisting of tin and an element selected from the group consisting of gold and silver, said electrode comprised of tin and said element in substantially equal atomic proportions, and electrodes attached to said body and said layer.

12. In a gallium arsenide signal translating device having a rectifying contact to a p-type conductivity region, the improvement wherein the rectifying contact comprises substantially equal atomic proportions of tin and an element selected from the group consisting of silver and gold.

References Cited in the file of this patent

UNITED STATES PATENTS

| | | |
|---|---|---|
| 2,847,335 | Gremmelmaier et al. | Aug. 12, 1958 |
| 2,938,819 | Genser | May 31, 1960 |

OTHER REFERENCES

IBM Tech Disclosure Bull., vol. 3, No. 7, December 1960.